(12) United States Patent
Egi

(10) Patent No.: US 6,335,250 B1
(45) Date of Patent: Jan. 1, 2002

(54) SEMICONDUCTOR DEVICE AND METHOD FOR THE MANUFACTURE THEREOF

(75) Inventor: Yuichiro Egi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/411,371

(22) Filed: Oct. 4, 1999

(30) Foreign Application Priority Data

Oct. 5, 1998 (JP) .......................................... 10-282616

(51) Int. Cl.[7] .............................................. H01L 21/336
(52) U.S. Cl. ...................................... 438/300; 438/592
(58) Field of Search ................................. 438/300, 592

(56) References Cited

U.S. PATENT DOCUMENTS

| 5,121,186 | A | 6/1992 | Wong et al. | ................ | 257/384 |
| 5,612,243 | A | 3/1997 | Verrett | ........................ | 438/233 |
| 5,691,212 | A | 11/1997 | Tsai et al. | .................... | 438/297 |
| 6,071,783 | A | * | 6/2000 | Liang et al. | ................. | 438/300 |
| 6,140,191 | A | * | 10/2000 | Gardner et al. | ............. | 438/301 |

* cited by examiner

Primary Examiner—John F. Niebling
Assistant Examiner—Stacy Whitmore
(74) Attorney, Agent, or Firm—Banner & Witcoff, Ltd.

(57) ABSTRACT

In a method of manufacturing a semiconductor device, gate electrodes are formed on a surface of a silicon substrate, and, over the surface of the silicon substrate thus formed, an amorphous silicon film is formed by deposition. Next, the amorphous silicon film is selectively grown to form single-crystalline film portions. Then, a resist is formed only on an interconnection formation portion. Thereafter, the amorphous silicon film portions and other than the amorphous silicon film portion which lies in the interconnection formation portion are removed. Then, a local interconnection layer comprised of a silicide film is formed the region of the amorphous silicon film portion lying in the interconnection formation portion and the regions of the single-crystalline silicon film portions. According to the above-mentioned manufacturing method, the step of forming the local interconnection layer is simplified which step was complicated in case of the conventional technique.

8 Claims, 3 Drawing Sheets

SEMICONDUCTOR DEVICE AND METHOD FOR THE MANUFACTURE THEREOF

BACKGROUND OF THE INVENTION

The present invention relates to a MOS transistor and, more particularly to a semiconductor device used for MOS transistors incorporating elevated source/drain technique and a method for the manufacture of the semiconductor device.

The local interconnection layer which connects the transistors adjacent to each other in, e.g., a static random access memory (SRAM) has so far been formed as follows:

First, a plurality of transistors are formed. Specifically, as shown in FIG. 7, an element isolation region 72 is formed in a surface region of a silicon substrate 71 to define a plurality of element formation regions 72 in the silicon substrate 71. Formed on each of the element regions of the silicon substrate 71 is a gate oxide film 73, on which a gate electrode 73 is formed. On the side surfaces of the oxide film 73 and the gate electrode 73, a gate side-wall spacer 75 is formed. After this, an impurity for forming source and drain regions is introduced into the silicon substrate 71, and thus, a plurality of transistors are formed.

Next, a local interconnection layer is formed. Specifically, a silicon nitride film 76 is formed by deposition on the surface of the silicon substrate 71 including the gates, as shown in FIG. 8. On the silicon nitride film 76, a silicon oxide film 77 is formed by deposition. On the silicon oxide film 77, a resist (not shown) is coated and then the resist film is patterned by the use of the lithography method.

Further, as shown in FIG. 9, using the patterned resist as a mask, only those portions of the silicon nitride film 76 and silicon oxide film 77 which lie in the local interconnection formation portion are etched to form an opening 77a. Next, on the silicon oxide film 77, a metal is deposited, whereby the opening 77a is filled up with the metal. Thereafter, the metal lying on the silicon oxide film 77 is removed by the use of the CMP (Chemical Mechanical Polishing) method, thus forming a local interconnection layer 78 in the opening 77a.

A local interconnection manufacturing method as mentioned above comprises a very complicated manufacturing step, that is, the step of depositing insulating materials on the silicon substrate 71 and then forming the opening 77a in the thus deposited insulation material.

Further, when the metal is removed by the use of CMP, the silicon oxide film 77 is polished, and thus, there is the possibility that even the transistors may be removed. Due to this, in the formation of the local interconnection layer 78, the silicon oxide film 77 must be formed thick. As a result, the aspect ratio of the opening 77a is increased, which leads to the problem that, in proportion to the thus increased thickness of the insulation film, the formation of the opening becomes more difficult.

Further, when the silicon nitride film 76 and the silicon oxide film 77 are etched to form the opening 77a, even the element isolation region 72 is etched in some cases. As a result, the surface of the element isolation region 72 is positioned below the bottom surfaces of the source and drain regions in the silicon substrate 71 in some cases. No current flows between the p-type region and the n-type region when a reverse bias is applied across the regions, however, in case the surface of the element isolation region 72 is lowered below the bottom surfaces of the source and drain regions, then leakage current flows into the silicon substrate 71, thus causing the problem of lowering the functions of the elements.

As described above, the conventional technique has the disadvantage that the local interconnection forming step is complicated, and the formation of the opening is difficult.

BRIEF SUMMARY OF THE INVENTION

The present invention has been made in order to achieve a solution to the above-mentioned disadvantage, and it is an object of the invention to provide a semiconductor device and a method for the formation thereof in which the step of forming the local interconnection layer is easy to execute.

According to a first aspect of the present invention, there is provided a semiconductor device comprising a gate electrode of a transistor formed on a surface of a semiconductor substrate; a source/drain region of the transistor, the source/drain region being at a side of the gate electrode of the transistor, a portion of the source/drain region being positioned higher than the surface of the semiconductor substrate; and an interconnection layer comprised of a silicide layer which is formed on an insulation film formed in the surface region of the semiconductor substrate, the interconnection layer connecting the source/drain region of the transistor to another active region and being formed at the same time as a silicide layer on the portion of the source/drain region of the transistor.

In the semiconductor device according to the first aspect of the present invention, the insulation film may comprise an element separation film formed in the surface region of the semiconductor substrate. The element separation film may comprise a shallow trench isolation film.

In the semiconductor device according to the first aspect of the present invention, the transistor may be of type of elevated source and drain.

In the semiconductor device according to the first aspect of the present invention, the silicide layer of the interconnection layer may be a silicide layer of a refractory metal. The silicide layer of the refractory metal may include a silicide layer of titanium (Ti), a silicide layer of cobalt (Co), a silicide layer of nickel (Ni), a silicide layer of platinum (Pt), a silicide layer of tungsten (W), and a silicide layer of molybdenum (Mo).

According to a second aspect of the present invention, there is provided a semiconductor device comprising an element separation film formed in a surface region of a semiconductor substrate, defining at least two element formation regions in the surface region of the semiconductor substrate; a transistor provided in each of the element formation regions, formed on the surface of the semiconductor substrate, the transistor having a gate electrode formed on the surface region of a semiconductor substrate and a source/drain region being at a side of the gate electrode, a portion of the source/drain region being positioned higher than the surface of the semiconductor substrate; and an interconnection layer comprised of a silicide layer which is formed on the element separation film, the interconnection layer connecting the source/drain region of the transistor formed in one of the element formation regions to the source/drain region of the transistor formed in another of the element formation regions.

In the semiconductor device according to the second aspect of the present invention, the element separation film may comprise a shallow trench isolation film.

In the semiconductor device according to the second aspect of the present invention, the transistor may be of type of elevated source and drain.

In the semiconductor device according to the second aspect of the present invention, the silicide layer of the interconnection layer may be a silicide layer of a refractory metal. The silicide layer of the refractory metal may include a silicide layer of titanium (Ti), a silicide layer of cobalt (Co), a silicide layer of nickel (Ni), a silicide layer of platinum (Pt), a silicide layer of tungsten (W), and a silicide layer of molybdenum (Mo).

According to a third aspect of the present invention, there is provided a method of manufacturing a semiconductor device comprising the steps of forming a gate insulation film of a transistor on a surface region of a semiconductor substrate; forming a gate electrode on the gate insulation film; forming an insulation film covering the gate insulation film and the gate electrode; forming by deposition an amorphous semiconductor layer over the surface region of the semiconductor substrate thus formed; selectively growing the amorphous semiconductor layer to form single-crystalline semiconductor layer portions in selected portions of the amorphous semiconductor layer; forming a resist layer on that portion of the amorphous semiconductor layer, which is in an interconnection formation portion; removing those portions of the amorphous semiconductor layer which are other than the that portion of the amorphous semiconductor layer which is in the interconnection formation portion; removing the resist layer; and depositing a metal layer on the that portion of the amorphous semiconductor layer which is in the interconnection formation portion and on the single-crystalline semiconductor layer portions and silicifying the metal film to form a silicide layer.

In the semiconductor device according to the third aspect of the present invention, the transistor may be of type of elevated source and drain.

In the semiconductor device according to the third aspect of the present invention, the metal layer may be a refractory metal layer and the silicide layer may be a silicide layer of the refractory metal. The refractory metal layer may include a titanium (Ti) layer, a silicide layer of cobalt (Co) layer, a silicide layer of nickel (Ni) layer, a silicide layer of platinum (Pt) layer, a silicide layer of tungsten (W) layer and a silicide layer of molybdenum (Mo) layer, and the silicide layer of the refractory metal includes a silicide layer of titanium (Ti), a silicide layer of cobalt (Co), a silicide layer of nickel (Ni), a silicide layer of platinum (Pt), a silicide layer of tungsten (W), and a silicide layer of molybdenum (Mo).

According to a fourth aspect of the present invention, there is provided a method of manufacturing a semiconductor device comprising the steps of forming an element separation film in a surface region of a semiconductor substrate to define at least two element formation regions in the surface region of the semiconductor substrate; forming a gate insulation film of a transistor in each of the element formation regions, on the surface region of the semiconductor substrate; forming a gate electrode on the gate insulation film; forming an insulation film covering the gate insulation film and the gate electrode; forming by deposition an amorphous semiconductor layer over the surface region of the semiconductor substrate thus formed; selectively growing the amorphous semiconductor layer to form single-crystalline semiconductor layer portions in selection portions of the amorphous semiconductor layer; forming a resist layer on that portion of the amorphous semiconductor layer, which is on a portion of the element separation film which is in an interconnection formation portion; removing those portions of the amorphous semiconductor layer which are other than that portion of the amorphous semiconductor layer which is on the element separation film and in the interconnection formation portion; removing the resist layer; and depositing a metal layer on that portion of the amorphous semiconductor layer which is on the element separation film and in the interconnection formation portion and on the single-crystalline semiconductor layer portions and silicifying the metal film to form a silicide layer.

In the semiconductor device according to the fourth aspect of the present invention, the transistor may be of type of elevated source and drain.

In the semiconductor device according to the fourth aspect of the present invention, the metal layer may be a refractory metal layer and the silicide layer may be a silicide layer of the refractory metal. The refractory metal layer may include a titanium (Ti) layer, a silicide layer of cobalt (Co) layer, a silicide layer of nickel (Ni) layer, a silicide layer of platinum (Pt) layer, a silicide layer of tungsten (W) layer and a silicide layer of molybdenum (Mo) layer, and the silicide layer of the refractory metal includes a silicide layer of titanium (Ti), a silicide layer of cobalt (Co), a silicide layer of nickel (Ni), a silicide layer of platinum (Pt), a silicide layer of tungsten (W), and a silicide layer of molybdenum (Mo).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described by reference to the drawings.

Figure 1:
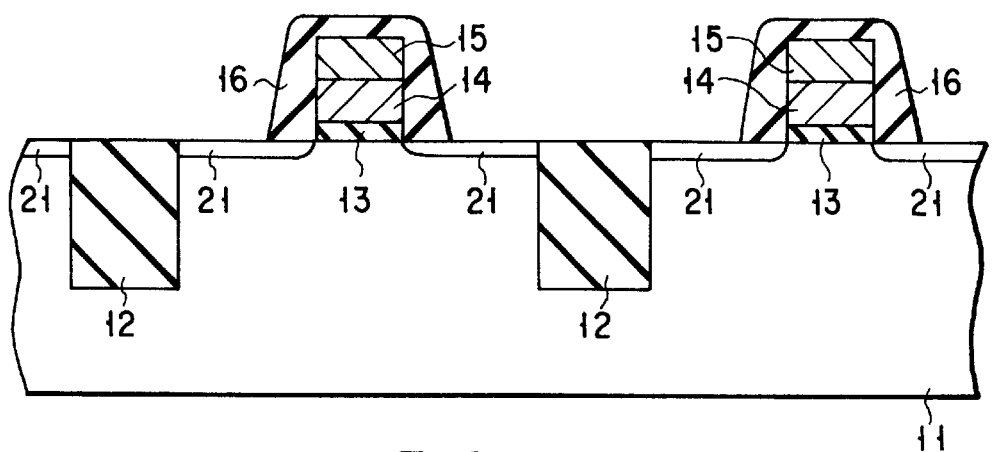
FIG. 1 is a sectional view of a semiconductor structure at a manufacturing step of a semiconductor device according to an embodiment of the present invention.

As shown in FIG. 1, an element isolation film i.e. an element isolation region 12 comprising, for example, an STI (Shallow Trench Isolation) film is formed in a surface region of a silicon substrate 11 to define a plurality of element regions in the surface region of the silicon substrate 11. Then formed on each of the element regions of the silicon substrate 11 is a gate oxide film 13, on which a polycrystalline silicon gate electrode 14 is formed. On the polycrystalline silicon gate electrode 14, a metal gate electrode 15 comprised of a refractory metal such as, e.g., tungsten (W) or titanium (Ti) is formed, thus forming a gate structure G comprised of the gate oxide film 13, the polycrystalline silicon gate electrode 14 and the metal gate electrode 15. Thereafter, using the gate electrode G as a mask, an impurity is introduced into the surface region of the silicon substrate 11 in a low concentration, so that LDD (Lightly Doped Drain) regions 21 are formed in the surface region of the silicon substrate 11. Subsequently, over the surface of the silicon substrate 11 thus formed, a silicon nitride film 16 is formed, and then, the nitride film 16 is etched back, so that the silicon nitride film 16 is left on the upper surface and side surface of each of the gate structures G.

Figure 2:
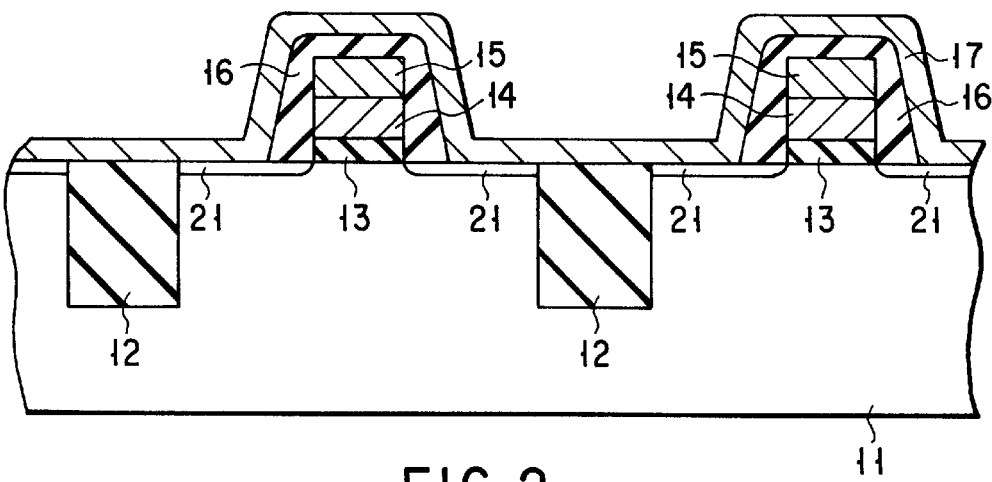
FIG. 2 is a sectional view of a semiconductor structure at a manufacturing step of the semiconductor device according to the embodiment of the present invention.

Next, as shown in FIG. 2, formed over the surface of the silicon substrate 11 thus formed, is an amorphous silicon film 17 for the formation of elevated source and drain in each of the element regions.

Figure 3:
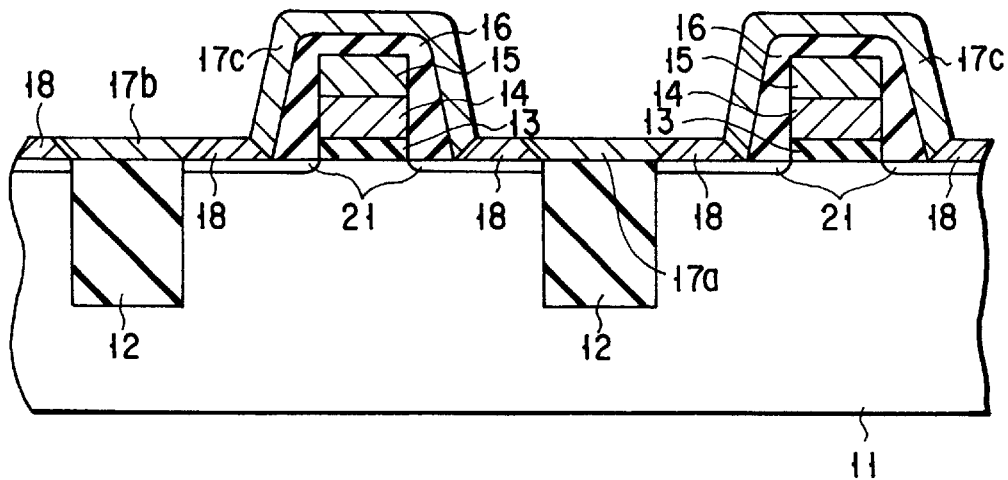
FIG. 3 is a sectional view of a semiconductor structure at a manufacturing step of the semiconductor device according to the embodiment of the present invention.

Thereafter, as shown in FIG. 3, the amorphous silicon film 17 is annealed under a condition of, for example, 700° C. and 30 minutes for a selective solid-phase epitaxial growth thereof. In this step, the amorphous silicon film 17 grows with the single-crystalline silicon of the silicon substrate 11 as a seed. Due to this, only those portions of the amorphous film 17, which lie on the source region and the drain region of each of the element regions, grow into a single-crystalline silicon film 18, thus forming the elevated source and drain on the source region and the drain region of each of the element regions. Those portions 17a, 17b and 17c of the amorphous silicon film, which lie on the element isolation film 12 and the silicon nitride film 16, do not grow into a single-crystalline silicon but remain amorphous.

Next, a resist is coated over the surface of the silicon substrate 11 thus formed to form a resist film. Patterning of the resist film is then performed by the use of the lithography method so that, as shown in FIG. 4, a portion of the resist film is left to form a resist pattern 19, which lies on the amorphous silicon film 17a which is in a local interconnection formation portion.

Figure 4:
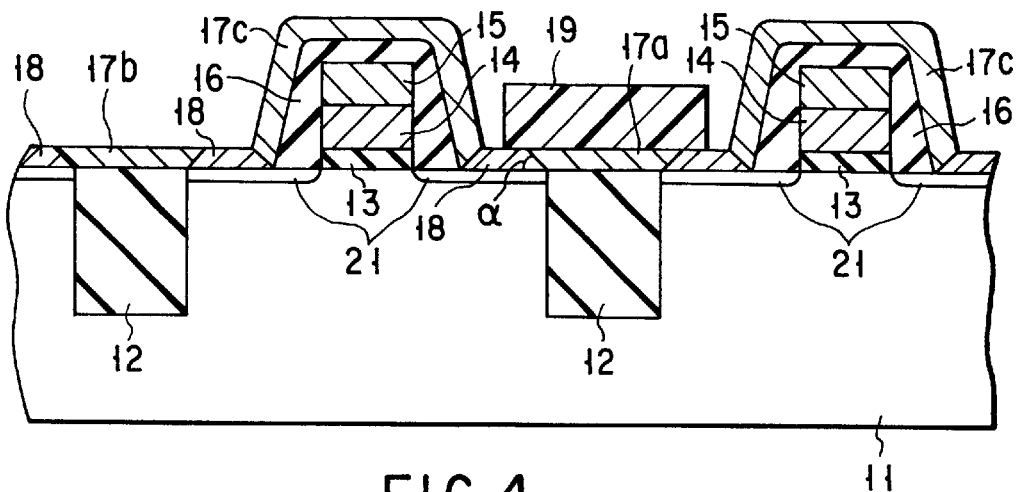
FIG. 4 is a sectional view of a semiconductor structure at a manufacturing step of the semiconductor device according to the embodiment of the present invention.

FIG. 4 shows, in particular, the resist pattern 19 formed in the local interconnection formation portion. In case of the above-mentioned solid-phase epitaxial growth, the angle a of the facet of the single-crystalline silicon film 18 is 54°. Due to this, the resist pattern 19 is required to be so large as to cover the surface of the amorphous silicon film portion 17a.

Figure 5:
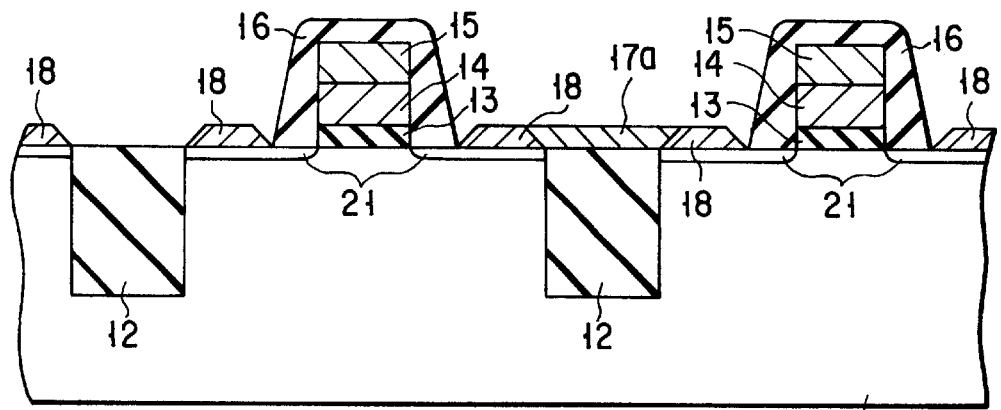
FIG. 5 is a sectional view of a semiconductor structure at a manufacturing step of the semiconductor device according to the embodiment of the present invention.
Figure 6:
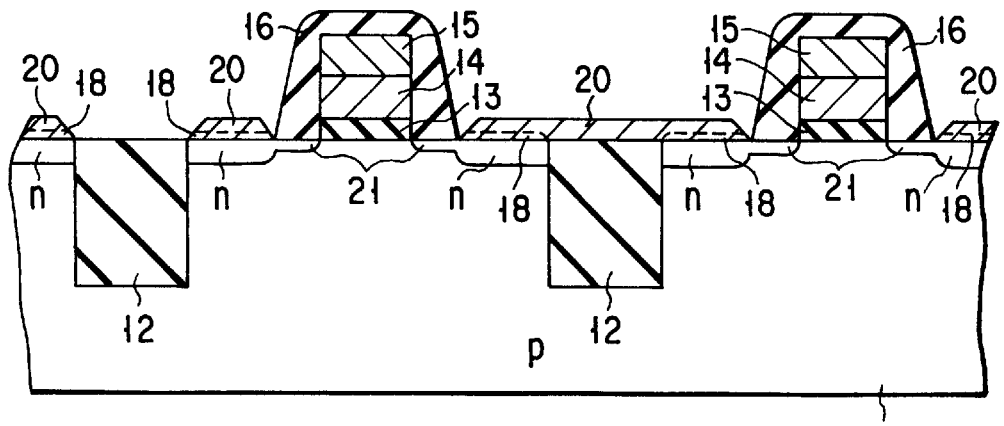
FIG. 6 is a sectional view of a semiconductor structure at a manufacturing step of the semiconductor device according to the embodiment of the present invention.
Figure 7:
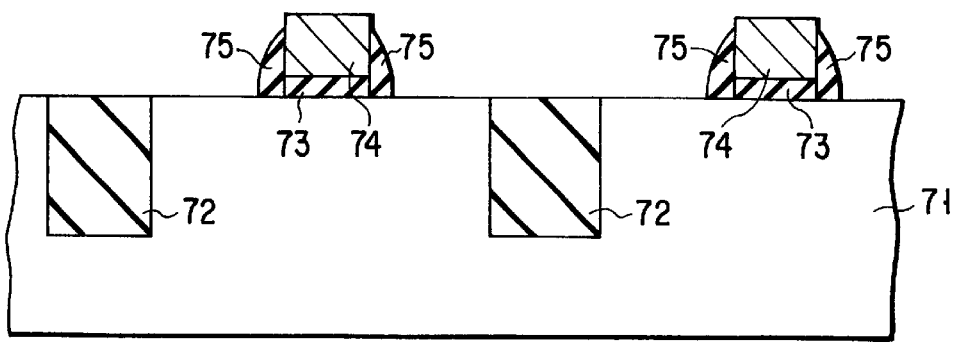
FIG. 7 is a sectional view of a semiconductor structure at a manufacturing step of a semiconductor device according to a conventional technique.
Figure 8:
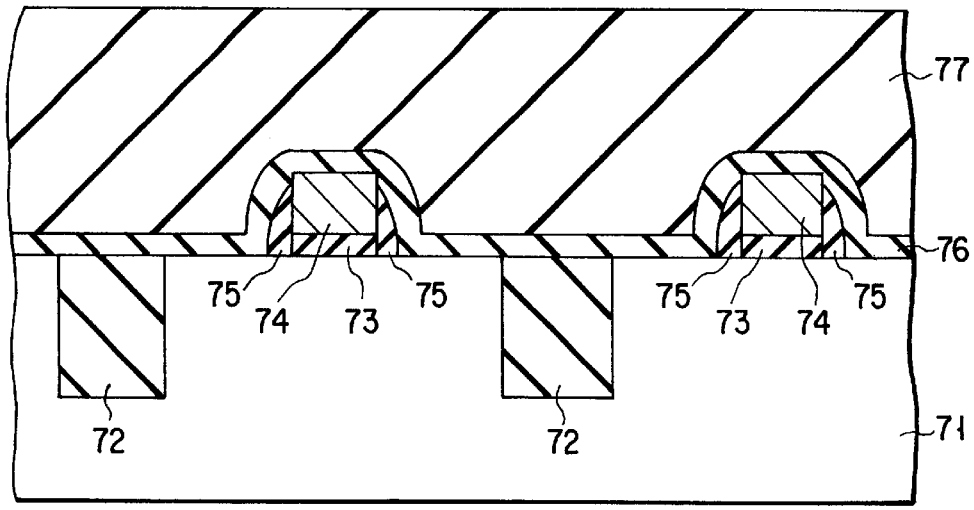
FIG. 8 is a sectional view of a semiconductor structure at a manufacturing step of the semiconductor device according to the conventional technique.
Figure 9:
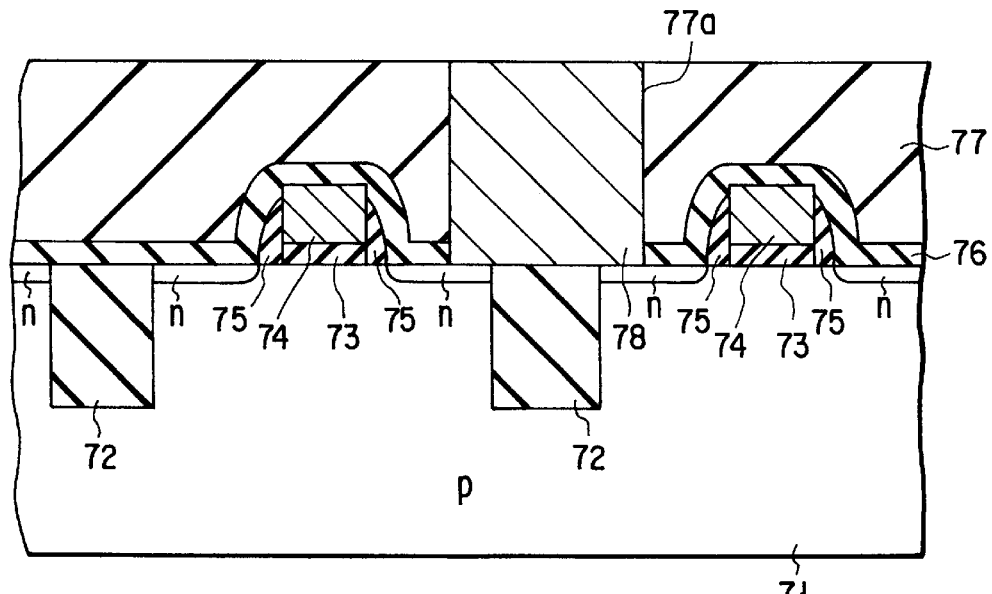
FIG. 9 is a sectional view of a semiconductor structure at a manufacturing step of the semiconductor device according to the conventional technique.

Next, as shown in FIG. 5, by the use of the CDE (Chemical Dry Etching) method using a mixture gas of CF4/O$_2$ at a ratio of, e.g., 2.5:1, the amorphous silicon film portion which lies on the element isolation region 12 but not covered with the resist pattern 19 and the amorphous silicon film portion which is on the silicon nitride film 16 are removed, that is, the amorphous silicon film portions 17b and 17c are removed. In this manufacturing step, the amorphous silicon film 17a is not removed since the resist pattern 19 functions as a mask for the etching. Thereafter, the resist pattern 19 is removed.

Next, a refractory metal film (not shown) is formed over the surface the silicon substrate thus formed. As the refractory metal, for example, titanium (Ti), cobalt (Co), nickel (Ni), platinum (Pt), tungsten (W), molybdenum (Mo), etc. can be included.

Next, annealing is performed, for example, at 800° C. for several tens of seconds, so that a silicide film 20 of the refractory metal is formed on the regions of the amorphous silicon film portion 17a and also on the single-crystalline silicon film portions 18. The silicide film 20 is formed on the STI film 12 and positioned higher than the pn junctions in the bottom surfaces of the source and drain regions. Thereafter, the non-reacted refractory metal film portion which has not grown to be the silicide film 20 is removed.

In the present invention, the step of forming the source and drain regions may be performed either before or after the epitaxial growth shown in FIG. 5.

For example, in case the formation of the source and drain regions is performed before the epitaxial growth, the source and drain regions are formed after the side walls of the silicon nitride film 16 are formed. Thereafter, the amorphous silicon film 17 is epitaxially grown and the silicide film 20 is formed.

On the other hand, in case the source the drain regions are formed after the epitaxial growth, the formation of the source and drain regions is performed after the side walls of the silicon nitride film 16 are formed, and the amorphous silicon film 17 is epitaxially grown. Thereafter, the silicide film 20 is formed. The source and drain regions and the silicide film 20 may each be formed earlier than the other.

As stated above, the local interconnection is provided by the amorphous silicon film 17 which is formed during the formation of the elevated source and drain. The step of etching the insulation films to form an opening and then filling the opening with a metal is unnecessary to be performed, so that, according to the present invention, the manufacturing process can be simplified as compared with the conventional manufacturing process. In addition, the step of forming an opening is not required, it does not cause that the element isolation region 12 is etched, and thus, the surface of the element isolation region 12 become lower than the bottom surfaces of the source and drain regions. Accordingly, the occurrence of leakage current can be prevented.

Furthermore, since the elevated source and drain is used, the silicide film can be thickened without deepening the source and drain regions, and thus, a required current capacity can be obtained with the short channel effect suppressed.

In the foregoing embodiment, description has been made with reference to the case where the source and drain regions of two transistors are connected, but the present invention is not limited to such a case but can also be applied to another case, for example, a case of connecting a transistor to a circuit element.

The present invention can be variously modified without departure of the gist of the invention.

As has been described above, according to the present invention, there can be provided a semiconductor device constituted in such a manner that the local interconnection layer can be formed with ease, and the occurrence of leakage current can be prevented, and there can also be provided a method for the manufacture of the above-mentioned semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming a gate insulation film of an active element on a surface region of a semiconductor substrate;

forming a gate electrode on the gate insulation film;

forming an insulation film covering the gate insulation film and the gate electrode;

forming by deposition an amorphous semiconductor layer over the surface region of the semiconductor substrate thus formed;

selectively growing the amorphous semiconductor layer to form single-crystalline semiconductor layer portions in selected portions of the amorphous semiconductor layer;

forming a resist layer on that portion of the amorphous semiconductor layer, which is in an interconnection formation portion between said active element and an adjacent active element;

removing those portions of the amorphous semiconductor layer which are other than said that portion of the amorphous semiconductor layer which is in the interconnection formation portion;

removing the resist layer; and depositing a metal layer on said that portion of the amorphous semiconductor layer which is in the interconnection formation portion and on the single-crystalline semiconductor layer portions and silicifying the metal film to form a silicide layer.

2. A method of manufacturing a semiconductor device according to claim 1, wherein the active element is of a type of elevated source and drain.

3. A method of manufacturing a semiconductor device according to claim 1, wherein the metal layer is a refractory metal layer and the silicide layer is a silicide layer of the refractory metal.

4. A method of manufacturing a semiconductor device according to claim 3, wherein the refractory metal layer includes one of a titanium (Ti) layer, a silicide layer of cobalt (Co) layer, a silicide layer of nickel (Ni) layer, a silicide layer of platinum (Pt) layer, a silicide layer of tungsten (W) layer and a silicide layer of molybdenum (Mo) layer, and the silicide layer of the refractory metal includes one of a silicide layer of titanium (Ti), a silicide layer of cobalt (Co), a silicide layer of nickel (Ni), a silicide layer of platinum (Pt), a silicide layer of tungsten (W), and a silicide layer of molybdenum (Mo).

5. A method of manufacturing a semiconductor device comprising the steps of:

forming an element separation film in a surface region of a semiconductor substrate to define at least two element formation regions in the surface region of the semiconductor substrate;

forming a gate insulation film of an active element in each of the element formation regions, on the surface region of the semiconductor substrate;

forming a gate electrode on the gate insulation film;

forming an insulation film covering the gate insulation film and the gate electrode;

forming by deposition an amorphous semiconductor layer over the surface region of the semiconductor substrate thus formed;

selectively growing the amorphous semiconductor layer to form single-crystalline semiconductor layer portions in selected portions of the amorphous semiconductor layer;

forming a resist layer on that portion of the amorphous semiconductor layer, which is on the element separation film and in an interconnection formation portion between said active element and an adjacent active element;

removing those portions of the amorphous semiconductor layer which are other than said that portion of the amorphous semiconductor layer which is on the element separation film and in the interconnection formation portion;

removing the resist layer; and depositing a metal layer on said that portion of the amorphous semiconductor layer which is on the element separation film and in the interconnection formation portion and on the single-crystalline semiconductor layer portions and silicifying the metal film to form a silicide layer.

6. A method of manufacturing a semiconductor device according to claim 5, wherein the active element is of a type of elevated source and drain.

7. A method of manufacturing a semiconductor device according to claim 5, wherein the metal layer is a refractory metal layer and the silicide layer is a silicide layer of the refractory metal.

8. A method of manufacturing a semiconductor device according to claim 7, wherein the refractory metal layer includes one of a titanium (Ti) layer, a silicide layer of cobalt (Co) layer, a silicide layer of nickel (Ni) layer, a silicide layer of platinum (Pt) layer, a silicide layer of tungsten (W) layer and a silicide layer of molybdenum (Mo) layer, and the silicide layer of the refractory metal includes one of a silicide layer of titanium (Ti), a suicide layer of cobalt (Co), a silicide layer of nickel (Ni), a silicide layer of platinum (Pt), a silicide layer of tungsten (W), and a silicide layer of molybdenum (Mo).

* * * * *

UNITED STATES PATENT AND TRADEMARK OFFICE
CERTIFICATE OF CORRECTION

PATENT NO. : 6,335,250 B1  
DATED : January 1, 2002  
INVENTOR(S) : Yuichiro Egi It is certified that error appears in the above-identified patent and that said Letters Patent is hereby corrected as shown below:

<u>Column 8,</u>
Line 51, delete "suicide" and insert -- silicide --.

Signed and Sealed this

Third day of September, 2002

Attest:

Attesting Officer

JAMES E. ROGAN
*Director of the United States Patent and Trademark Office*